US009412791B2

(12) United States Patent
Takahashi et al.

(10) Patent No.: US 9,412,791 B2
(45) Date of Patent: Aug. 9, 2016

(54) SOLID STATE IMAGING ELEMENT, PRODUCTION METHOD THEREOF AND ELECTRONIC DEVICE

(71) Applicant: Sony Corporation, Tokyo (JP)

(72) Inventors: Shingo Takahashi, Kanagawa (JP); Masahiro Joei, Kanagawa (JP); Kaori Takimoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/597,738

(22) Filed: Jan. 15, 2015

(65) Prior Publication Data

US 2015/0206925 A1    Jul. 23, 2015

(30) Foreign Application Priority Data

Jan. 22, 2014   (JP) ................... 2014-009181

(51) Int. Cl.
*H01L 27/30* (2006.01)
*H01L 51/00* (2006.01)
*H01L 51/44* (2006.01)

(52) U.S. Cl.
CPC .......... *H01L 27/307* (2013.01); *H01L 51/0002* (2013.01); *H01L 51/0021* (2013.01); *H01L 51/442* (2013.01); *H01L 51/448* (2013.01); *Y02E 10/549* (2013.01)

(58) Field of Classification Search
CPC ............ H01L 21/02337; H01L 21/02359; H01L 27/307; H01L 51/0002; H01L 51/448; H01L 51/442; H01L 51/0021

USPC .............................................. 257/40; 438/82
See application file for complete search history.

(56) References Cited

U.S. PATENT DOCUMENTS

| 2002/0027206 A1* | 3/2002 | Yuan | H01L 31/173 |
| | | | 250/551 |
| 2003/0039766 A1* | 2/2003 | Barnes | C23C 16/54 |
| | | | 427/569 |
| 2006/0003097 A1* | 1/2006 | Andres | B05D 1/00 |
| | | | 427/212 |
| 2006/0061270 A1* | 3/2006 | Uhlig | H01L 51/5206 |
| | | | 313/506 |

FOREIGN PATENT DOCUMENTS

| JP | 2005-032774 A | 2/2005 |
| JP | 2007-103921 A | 4/2007 |
| JP | 2011-029337 A | 2/2011 |

* cited by examiner

*Primary Examiner* — Marc Armand
*Assistant Examiner* — Quovaunda V Jefferson
(74) *Attorney, Agent, or Firm* — Sheridan Ross P.C.

(57) ABSTRACT

There is provided a solid state imaging element including: an insulation film laminated on a semiconductor substrate; a lower transparent electrode film formed and separated by the insulation film per pixel; a hydrophobic treatment layer laminated on a flat surface of the insulation film and the lower transparent electrode film; an organic photoelectric conversion layer laminated on the hydrophobic treatment layer; and an upper transparent electrode film laminated on the organic photoelectric conversion layer. Also, there is provided a production method thereof and an electronic device.

12 Claims, 5 Drawing Sheets

Silylation treatment

HMDS (Hexamethyl silazane)

Organic vapor deposition film

SOLID STATE IMAGING ELEMENT, PRODUCTION METHOD THEREOF AND ELECTRONIC DEVICE

CROSS REFERENCE TO RELATED APPLICATIONS

This application claims the benefit of Japanese Priority Patent Application JP 2014-009181 filed Jan. 22, 2014, the entire contents of which are incorporated herein by reference.

BACKGROUND

The present disclosure relates to a solid state image sensor, a production method thereof and an electronic device. More particularly, the present disclosure relates to a solid state imaging element, a production method thereof and an electronic device providing improved device properties.

SUMMARY

In the related art, in an electronic device having an image capturing function such as a digital still camera and a digital video camera, a solid state imaging element such as a Charge Coupled Device (CCD) and a Complementary Metal Oxide Semiconductor (CMOS) image sensor is used. The solid state imaging element has a pixel where photodiode (PD) for photoelectric conversion and a plurality of transistor are combined. A plurality of pixels are disposed planarly and output pixel signals. Based on the pixel signals, images are constructed.

In recent years, the solid state imaging element where photoelectric conversion units in green, blue and red colors are laminated in a depth direction of the same pixel has been developed.

For example, Japanese Patent Application Laid-open No. 2011-29337 discloses a solid state imaging element including a photoelectrically conversion unit for photoelectrically converting blue light and a photoelectrically conversion unit for photoelectrically converting red light, both are formed in a depth direction of a silicon substrate; and an organic photoelectrically conversion layer for photoelectrically converting green light disposed on a surface upper layer of the silicon substrate. The solid state imaging element can improve sensitivity property since no color filter light loss is induced. Also, the solid state imaging element can avoid false color generation since no interpolation processing between pixels is performed.

It is known that orientations of organic molecules in the organic photoelectrically conversion layer significantly affect electron physical properties such as absorbance, mobility and ionization energy. It is important to control the orientations in order to improve the device properties.

For example, Japanese Patent Application Laid-open No. 2007-103921 discloses a semiconductor device where a polymer compound containing layer is laminated, the polymer compound has a structure such that an organic semiconductor layer having high crystallinity and orientation.

In addition, Japanese Patent Application Laid-open No. 2005-32774 discloses an organic thin film transistor having a threshold voltage control film formed of a predetermined compound disposed between a gate insulation film and an organic semiconductor thin film so that a threshold voltage can be easily controlled.

The solid state imaging element having the organic photoelectrically conversion layer disclosed in Japanese Patent Application Laid-open No. 2011-29337 has a structure that the organic photoelectrically conversion layer is formed on a flat surface of a transparent electrode and an insulation film. As described above, it is known that the orientations of organic molecules in the organic photoelectrically conversion layer significantly affect electron physical properties such as absorbance, mobility and ionization energy. When the orientations are controlled, the device properties can be improved.

However, the orientations of organic molecules in the organic photoelectrically conversion layer formed on the flat surface of the transparent electrode and the insulation film are not controlled in the related art. There is a need to improve the device properties by controlling the orientations.

In view of the circumstances as described above, it is desirable that the device properties are improved.

According to an embodiment of the present disclosure, there is provided a solid state imaging element, including:

an insulation film laminated on a semiconductor substrate;
a lower transparent electrode film formed and separated by the insulation film per pixel;
a hydrophobic treatment layer laminated on a flat surface of the insulation film and the lower transparent electrode film;
an organic photoelectric conversion layer laminated on the hydrophobic treatment layer; and
an upper transparent electrode film laminated on the organic photoelectric conversion layer.

According to an embodiment of the present disclosure, there is provided a method of producing a solid state imaging element, including:

laminating an insulation film on a semiconductor substrate;
forming a lower transparent electrode film separated by the insulation film per pixel;
laminating a hydrophobic treatment layer on a flat surface of the insulation film and the lower transparent electrode film;
laminating an organic photoelectric conversion layer on the hydrophobic treatment layer; and
laminating an upper transparent electrode film on the organic photoelectric conversion layer.

According to an embodiment of the present disclosure, there is provided an electronic device having a solid state imaging element, including:

an insulation film laminated on a semiconductor substrate;
a lower transparent electrode film formed and separated by the insulation film per pixel;
a hydrophobic treatment layer laminated on a flat surface of the insulation film and the lower transparent electrode film;
an organic photoelectric conversion layer laminated on the hydrophobic treatment layer; and
an upper transparent electrode film laminated on the organic photoelectric conversion layer.

In other words, according to an embodiment of the present disclosure, an insulation film is laminated on a semiconductor substrate, a lower transparent electrode film is formed and separated by the insulation film per pixel, a hydrophobic treatment layer laminated on a flat surface of the insulation film and the lower transparent electrode film. An organic photoelectric conversion layer is laminated on the hydrophobic treatment layer and an upper transparent electrode film is laminated on the organic photoelectric conversion layer.

According to an embodiment of the present disclosure, the device properties can be improved.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
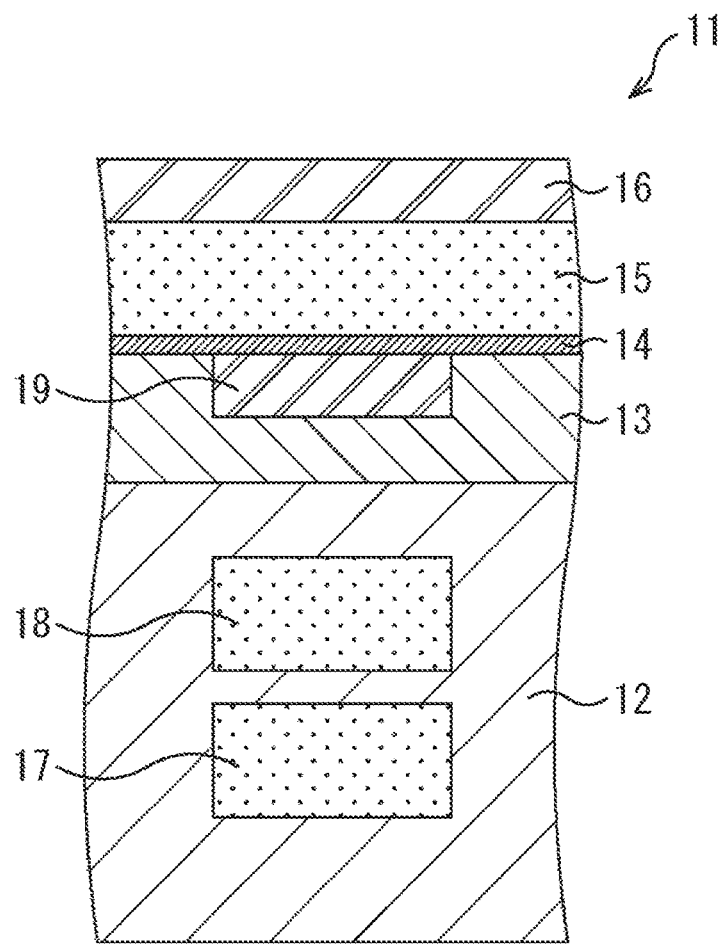
FIG. 1 is a diagram showing an illustrative configuration of a solid state imaging element according to a first embodiment of the present disclosure.

FIG. 1 is a diagram showing an illustrative configuration of a solid state imaging element according to a first embodiment of the present disclosure.

FIG. 1 shows a partial sectional structure of one pixel in a solid state imaging element 11. Hereinafter, a face in an upper side is defined as an upper face and a face in a lower side is defined as a lower face, as appropriate in FIG. 1.

The solid state imaging element 11 is composed of a semiconductor substrate 12, an insulation film 13, a hydrophobic treatment layer 14, an organic photoelectric conversion layer 15 and an upper transparent electrode film 16 which are laminated from a bottom. In the solid state imaging element 11, photoelectric conversion areas 17 and 18 are formed in the semiconductor substrate 12, and a lower transparent electrode film 19 is formed in contact with the organic photoelectric conversion layer 15 via the hydrophobic treatment layer 14.

The semiconductor substrate 12 is a silicon wafer provided by slicing thinly a high purity silicon monocrystal, for example.

The insulation film 13 is formed of an oxide film having an insulation property and is laminated on the upper face of the semiconductor substrate 12.

The hydrophobic treatment layer 14 is formed by performing a surface treatment of upper faces of the insulation film 13 and the lower transparent electrode film 19 with a silylation agent. For example, when hexamethyl silazane (HMDS) is used as the silylation agent for forming the hydrophobic treatment layer 14, an HMDS layer is formed. The surface treatment thereof is described later referring to FIG. 2.

The organic photoelectric conversion layer 15 is formed by depositing quinacridone using a vacuum vapor deposition method on an upper face of the hydrophobic treatment layer 14. For example, the organic photoelectric conversion layer 15 photoelectrically converts green light.

The upper transparent electrode film 16 is formed by laminating a conductive transparent material such as an indium tin oxide (ITO) film on an upper face of the organic photoelectric conversion layer 15.

The photoelectric conversion areas 17 and 18 are composed of P-N junction within the semiconductor substrate 12 and photoelectrically convert received light.

In the illustrative configuration shown in FIG. 1, the photoelectric conversion area 17 is disposed at a position deeper than the photoelectric conversion area 18.

For example, the photoelectric conversion area 17 photoelectrically converts red light and the photoelectric conversion area 18 photoelectrically converts blue light.

The lower transparent electrode film 19 is separated by the insulation film 13 per pixel and is formed in contact with a lower face of the organic photoelectric conversion layer 15 via the hydrophobic treatment layer 14. The lower transparent electrode film 19 is formed of a conductive transparent material such as an ITO film similar to the upper transparent electrode film 16. The lower transparent electrode film 19 is connected to a transfer transistor (not shown) and is used for transferring electric charges photoelectrically converted by the organic photoelectric conversion layer 15 disposed between the lower transparent electrode film 19 and the upper transparent electrode film 16.

The solid state imaging element 11 is configured in this manner. After the hydrophobic treatment layer 14 is formed on a flat surface of the insulation film 13 and the lower transparent electrode film 19, the organic photoelectric conversion layer 15 is formed, which allows an orientation property of the organic photoelectric conversion layer 15 to be controlled.

Figure 2:
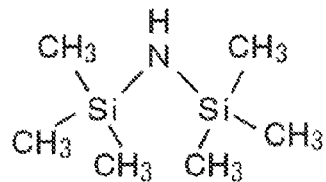
FIG. 2 is a diagram illustrating a surface treatment for forming a hydrophobic treatment layer.
Figure 2:
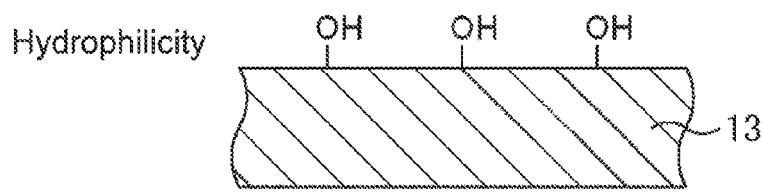
Figure 2:
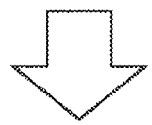
Figure 2:
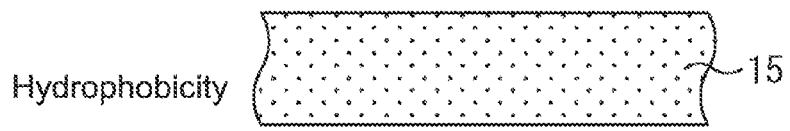
Figure 2:
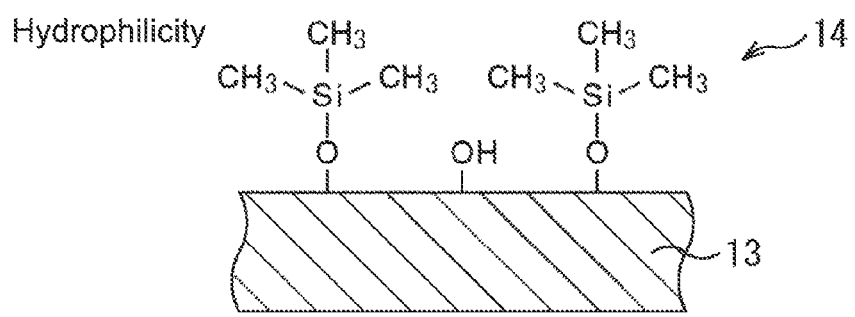

Next, referring to FIG. 2, the surface treatment for forming the hydrophobic treatment layer 14 is described.

The hydrophobic treatment layer 14 is formed by performing the surface treatment using a silylation agent on the insulation layer 13 and the lower transparent electrode film 19. Although only the insulation film 13 is shown in FIG. 2, the similar surface treatment is performed on the lower transparent electrode film 19 as well.

A surface of the insulation film 13 has hydrophilicity. Before an organic vapor deposition treatment for forming the organic photoelectric conversion layer 15 is performed, the surface treatment (a hydrophobic treatment) by the silylation agent is performed on the surface of the insulation film 13. Examples of the silylation agent used in the surface treatment include the above-described HDMS [$Si(CH_3)_3)_2NH$] as well as 1,1,3,3-tetramethyl disilazane [TMDS, [$SiH(CH_3)_2]_2NH$], N-trimethylsilyldimethylamine (TMSDMA, $(CH_3)_5NSi$), N-dimethylsilyldimethylamine (DMSDMA, $(CH_3)_4NHSi$), 1-trimethylsilylpyrole (TMS pyrole), N,O-bis(trimethylsilyl) trifuluoroacetamide) (BSTFA) and bis(dimethylamino)dimethylsilane (BDMADMS).

The surface treatment is performed using the silylation agent to form the hydrophobic treatment layer 14 on the surface of the insulation film 13. As shown in a lower section of FIG. 2, the organic photoelectric conversion layer 15 having hydrophobicity is formed on the hydrophobic treatment layer 14 having hydrophobicity.

In this manner, adhesion between the organic photoelectric conversion layer 15 and the insulation film 13/the lower transparent electrode film 19 can be improved and the organic photoelectric conversion layer 15 can be inhibited from peeling.

The organic photoelectric conversion layer 15 thus formed can be controlled to have a suitable crystal orientation status, i.e., an orientation status in parallel with (face-on) the substrate.

Figure 3:
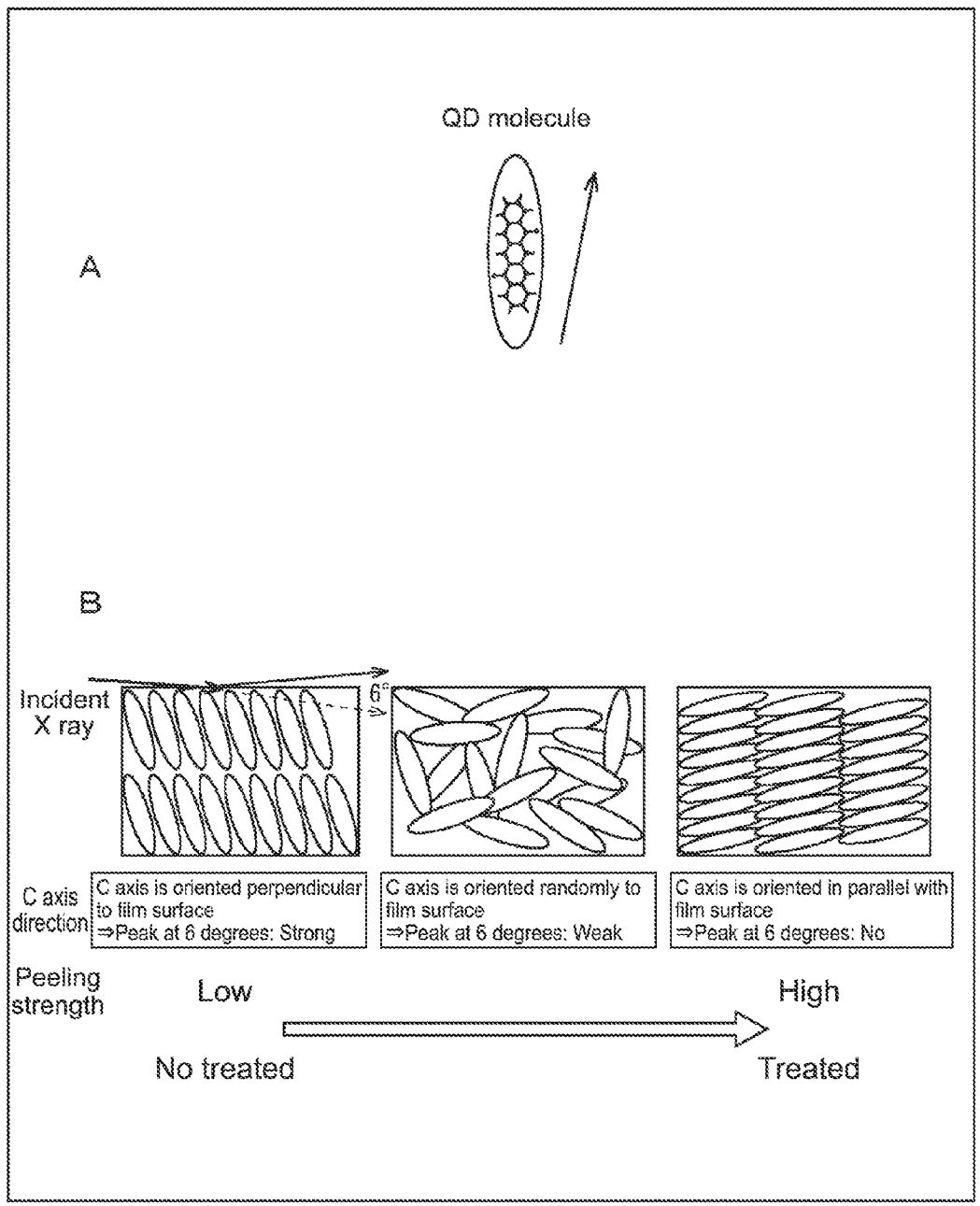
FIG. 3 is a diagram illustrating a crystal orientation status of an organic vapor deposition film.

Referring to FIG. 3, the crystal orientation status of the organic vapor deposition film used for the organic photoelectric conversion layer 15 is described.

FIG. 3A shows a molecular structure and a C axis direction of a quinacridone (QD) molecule constituting the organic vapor deposition film used for the organic photoelectric conversion layer 15.

As shown in FIG. 3B, when no surface treatment by the silylation agent is performed, the organic vapor deposition film is formed to have the orientation status such that the C axis of the quinacridone molecule is almost perpendicular to a film surface. At this time, the organic vapor deposition film shows a trend that a peak at 6 degrees in an X ray diffraction is strong and a peeling strength becomes low.

In contrast, when the surface treatment by the silylation agent is performed, the organic vapor deposition film is formed to have the orientation status such that the C axis of the quinacridone molecule is almost in parallel with the film surface. At this time, the organic vapor deposition film shows a trend that a peak at 6 degrees in an X ray diffraction is weak (or no peak is provided) and a peeling strength becomes high.

Depending on the extent of the surface treatment by the silylation agent, the organic vapor deposition film can be formed to have the orientation status such that the C axis of the quinacridone molecule is oriented randomly to the film surface. At this time, the organic vapor deposition film shows a trend that a peak at 6 degrees in an X ray diffraction is weak.

As described above, in the solid state imaging element 11, the hydrophobic treatment layer 14 is formed by performing the surface treatment of the upper faces of the insulation film 13 and the lower transparent electrode film 19 with a silylation agent. The organic photoelectric conversion layer 15 formed on the hydrophobic treatment layer 14 can be controlled for the orientation property to have the suitable crystal orientation status. In this manner, the orientation property of the organic photoelectric conversion layer 15 is controlled, thereby improving device properties (such as a conversion efficiency, adhesion properties and electronic properties) of the solid state imaging element 11.

Figure 4:
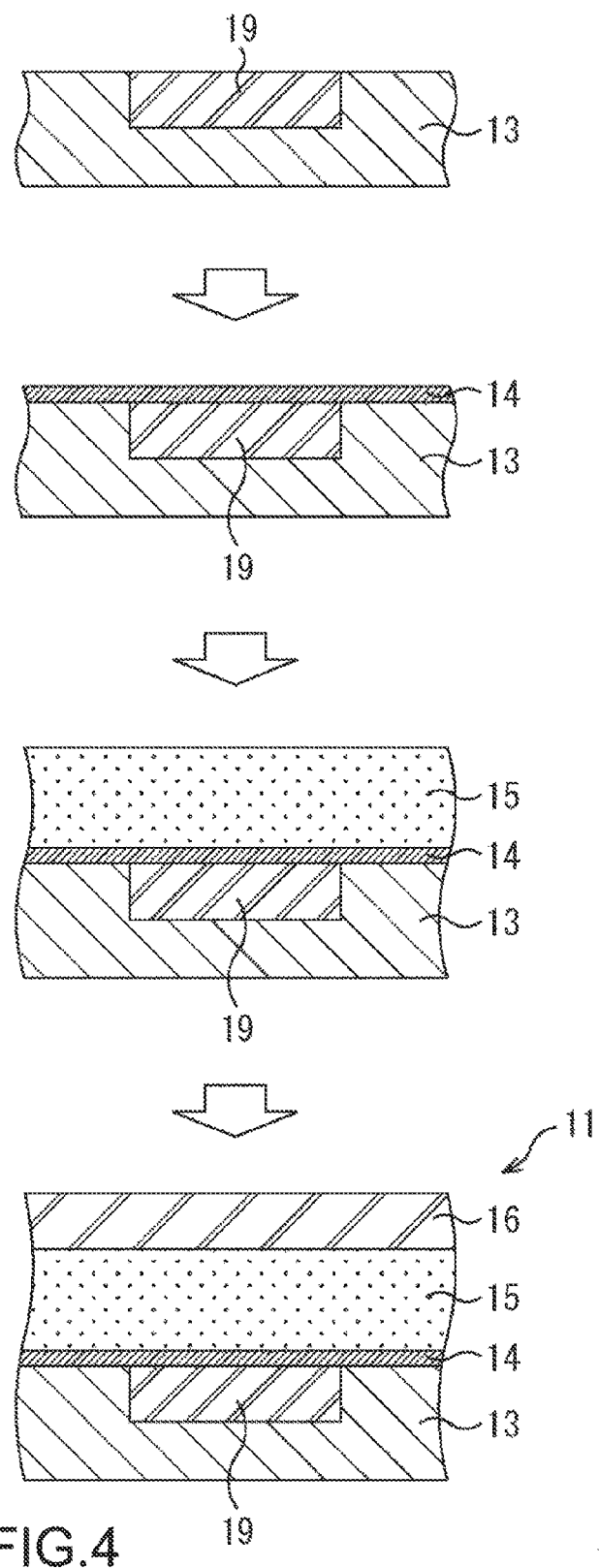
FIG. 4 is a diagram illustrating a method of producing the solid state imaging element.

Referring to FIG. 4, a method of producing the solid state imaging element 11 is described.

In a first step, the insulation film 13 is formed on the semiconductor substrate 12 in which the photoelectric conversion areas 17 and 18 are formed shown in FIG. 1 and the lower transparent electrode film 19 is formed corresponding to an area where the pixel is formed.

ITO having a film thickness of 50 to 200 nm is used for the lower transparent electrode film 19, for example. Also, other than ITO, tin oxide (TO), a tin oxide based material to which a dopant is added, or a zinc oxide ($SnO_2$) based material provided by adding a dopant to zinc oxide (ZnO) may be used. Specific examples of a zinc oxide based material include aluminum zinc oxide (AZO) to which aluminum (Al) is added as a dopant, gallium zinc oxide to which gallium (Ga) is added and indium zinc oxide to which indium (In) is added. In addition to these, IGZO, CuI, $InSbO_4$, ZnMgO, $CuInO_2$, $MgIN_2O_4$, CdO or $ZnSnO_3$ may be used.

Next, in a second step, the hydrophobic treatment layer 14 is formed by performing a silylation treatment to the upper faces of the insulation film 13 and the lower transparent electrode film 19. Any layer other than the HMDS layer may be used for the hydrophobic treatment layer 14. A formation method is not especially limited. For example, a gas phase method such as a CVD method or a liquid phase method such as a spin coating method and a dipping method may be used. A film thickness of the hydrophobic treatment layer 14 can be about one molecular layer, e.g., suitably less than 1 nm.

Thereafter, in a third step, the organic photoelectric conversion layer 15 is formed. The organic photoelectric conversion layer 15 can have a laminated structure of a multilayer organic film, e.g., p, i, n layer or back and forth thereof sandwiched by buffer layers. The organic film may include one or more film selected from the group consisting of: organic low molecules such as pentacene and oligothiophene, organic high molecules such as polychiophene, a metal complex such as phthalocyanine, fullerenes such as C60, C70 and endohedral metallofullerene, and carbon nanotubes.

In a fourth step, the upper transparent electrode film 16 is formed on the upper face of the organic photoelectric conversion layer 15. The upper transparent electrode film 16 is formed of the material similar to the above-described lower transparent electrode film 19.

By the production method as described above, the solid state imaging element 11 can be produced.

Figure 5:
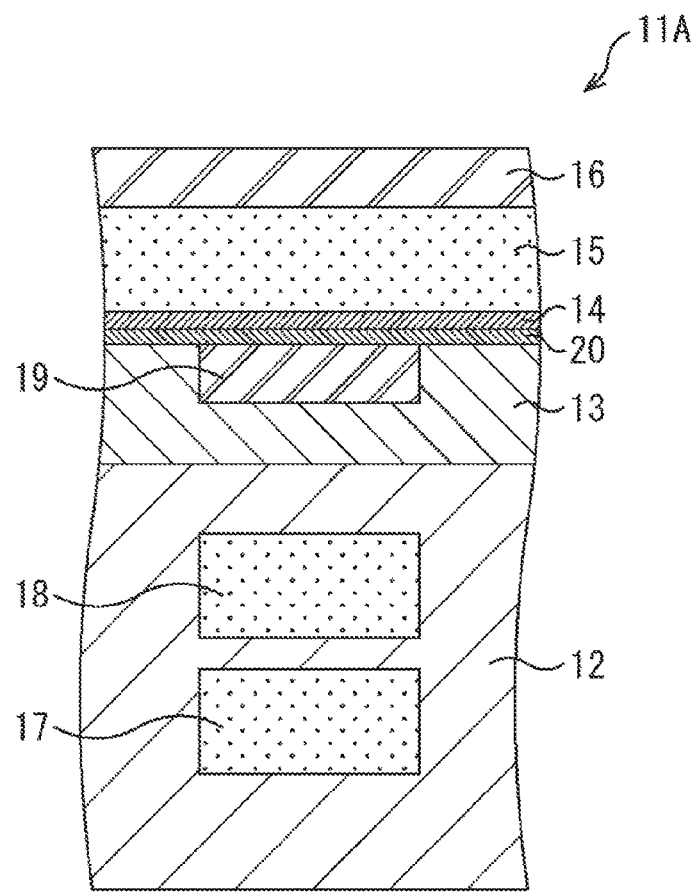
FIG. 5 is a diagram showing an illustrative configuration of a solid state imaging element according to a second embodiment.

Next, FIG. 5 is a diagram showing an illustrative configuration of the solid state imaging element 11 according to a second embodiment.

As shown in FIG. 5, a solid state imaging element 11A has a structure different from the solid state imaging element 11 shown in FIG. 1 in that an inorganic buffer layer 20 is disposed between the hydrophobic treatment layer 14 and the insulation layer 13/the lower transparent electrode film 19. The solid state imaging element 11A has the structure similar to the solid state imaging element 11 shown in FIG. 1 otherwise. Therefore, common structural elements are denoted by the same reference numerals, and thus detailed description thereof will be hereinafter omitted.

In the solid state imaging element 11A, after the inorganic buffer layer 20 is formed on the upper surface of the insulation film 13 and the lower transparent electrode film 19, the hydrophobic treatment is performed using the silylation agent to form the hydrophobic treatment layer 14 and the organic vapor deposition treatment is performed to form the organic photoelectric conversion layer 15. As the inorganic buffer layer 20, titanium oxide ($TiO_2$), tantalum pentoxide ($Ta_2O_5$) or zinc oxide (ZnO) can be used.

By disposing the inorganic buffer layer 20, in the solid state imaging element 11A, adhesion between the organic photoelectric conversion layer 15 and the lower transparent electrode film 19 can be further improved. In the organic photoelectric conversion layer 15, the dark current is suppressed from being generated.

The solid state imaging element 11 in the above-described embodiments can be applied to a variety of electronic devices such as an image capturing system such as a digital still camera and a digital video camera; a mobile phone having an image capturing function; or other devices each having an image capturing function.

Figure 6:
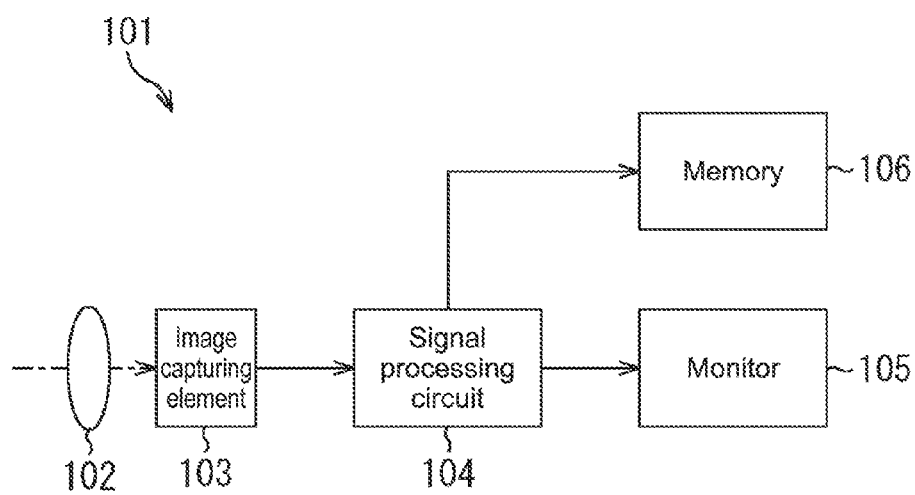
FIG. 6 is a block diagram showing an illustrative configuration of an electronic device.

FIG. 6 is a block diagram showing an illustrative configuration of an electronic device mounted to an electronic device.

As shown in FIG. 6, an image capturing apparatus 101 is composed of an optical system 102, an image capturing element 103, a signal processing circuit 104, a monitor 105 and a memory 106 and can capture a still image and a moving image.

The optical system 102 is composed of one or more lenses, guides image light (incident light) from a subject to the image capturing element 103, and forms an image on a light receiving surface (sensor unit) of the image capturing element 103.

To the image capturing element 103, the solid state imaging element 11 in the above-described embodiments is applied. Electrons are accumulated in the image capturing element 103 for a certain period of time corresponding to the image formed on the light receiving surface via the optical system 102. A signal corresponding to the electrons accumulated on the image capturing element 103 is fed to the signal processing circuit 104.

The signal processing circuit 104 performs a variety of signal processing to the pixel signal outputted from the image capturing element 103. The image (image data) provided by performing the signal processing by the signal processing circuit 104 is supplied to and displayed on the monitor 105 or supplied to and stored (recorded) on the memory 106.

When the solid state imaging element 11 in the above-described embodiments is applied to the image capturing apparatus 101 configured in this manner, an image having a higher image quality can be provided, for example.

The present disclosure may have the following configurations.

(1) A solid state imaging element, including:
an insulation film laminated on a semiconductor substrate;
a lower transparent electrode film formed and separated by the insulation film per pixel;
a hydrophobic treatment layer laminated on a flat surface of the insulation film and the lower transparent electrode film;
an organic photoelectric conversion layer laminated on the hydrophobic treatment layer; and
an upper transparent electrode film laminated on the organic photoelectric conversion layer.

(2) The solid state imaging element according to (1) above, in which
the hydrophobic treatment layer is formed by performing a surface treatment of surfaces of the insulation film and the lower transparent electrode film with a silylation agent.

(3) The solid state imaging element according to (2) above, in which
hexamethyl silazane is used as the silylation agent used in the surface treatment for forming the hydrophobic treatment layer.

(4) The solid state imaging element according to (2) above, in which
one of 1,1,3,3-tetramethyl disilazane [TMDS, [SiH$(CH_3)_2]_2$NH], N-trimethylsilyldimethylamine (TMSDMA, $(CH_3)_5$NSi), N-dimethylsilyldimethylamine (DMSDMA, $(CH_3)_4$NHSi), 1-trimethylsilylpyrole (TMS pyrole), N,O-bis(trimethylsilyl)trifuluoroacetamide) (BSTFA) and bis(dimethylamino)dimethylsilane (BDMADMS) is used as the silylation agent used in the surface treatment for forming the hydrophobic treatment layer.

(5) The solid state imaging element according to any one of (1) to (4) above, in which
an inorganic buffer layer is disposed between the hydrophobic treatment layer and the insulation layer and the lower transparent electrode film.

(6) A method of producing a solid state imaging element, including:
laminating an insulation film on a semiconductor substrate;
forming a lower transparent electrode film separated by the insulation film per pixel;
laminating a hydrophobic treatment layer on a flat surface of the insulation film and the lower transparent electrode film;
laminating an organic photoelectric conversion layer on the hydrophobic treatment layer; and
laminating an upper transparent electrode film on the organic photoelectric conversion layer.

(7) The method of producing a solid state imaging element according to (6) above, in which
the hydrophobic treatment layer is formed by performing a surface treatment of surfaces of the insulation film and the lower transparent electrode film 19 with a silylation agent.

(8) The method of producing a solid state imaging element according to (7) above, in which
hexamethyl silazane is used as the silylation agent used in the surface treatment for forming the hydrophobic treatment layer.

(9) The method of producing a solid state imaging element according to (7) above, in which
one of 1,1,3,3-tetramethyl disilazane [TMDS, [SiH$(CH_3)_2]_2$NH], N-trimethylsilyldimethylamine (TMSDMA, $(CH_3)_5$NSi), N-dimethylsilyldimethylamine (DMSDMA, $(CH_3)_4$NHSi), 1-trimethylsilylpyrole (TMS pyrole), N,O-bis(trimethylsilyl)trifuluoroacetamide) (BSTFA) and bis(dimethylamino)dimethylsilane (BDMADMS) is used as the silylation agent used in the surface treatment for forming the hydrophobic treatment layer.

(10) The method of producing a solid state imaging element according to any one of (6) to (9) above, in which
an inorganic buffer layer is disposed between the hydrophobic treatment layer and the insulation layer and the lower transparent electrode film.

(11) An electronic device having a solid state imaging element, including:
an insulation film laminated on a semiconductor substrate;
a lower transparent electrode film formed and separated by the insulation film per pixel;
a hydrophobic treatment layer laminated on a flat surface of the insulation film and the lower transparent electrode film;
an organic photoelectric conversion layer laminated on the hydrophobic treatment layer; and
an upper transparent electrode film laminated on the organic photoelectric conversion layer.

(12) The electronic device according to (11) above, in which
the hydrophobic treatment layer is formed by performing a surface treatment of surfaces of the insulation film and the lower transparent electrode film with a silylation agent.

(13) The electronic device according to (12) above, in which
hexamethyl silazane is used as the silylation agent used in the surface treatment for forming the hydrophobic treatment layer.

(14) The electronic device according to (12) above, in which
one of 1,1,3,3-tetramethyl disilazane [TMDS, [SiH$(CH_3)_2]_2$NH], N-trimethylsilyldimethylamine (TMSDMA, $(CH_3)_5$NSi), N-dimethylsilyldimethylamine (DMSDMA, $(CH_3)_4$NHSi), 1-trimethylsilylpyrole (TMS pyrole), N,O-bis(trimethylsilyl)trifuluoroacetamide) (BSTFA) and bis(dimethylamino)dimethylsilane (BDMADMS) is used as the silylation agent used in the surface treatment for forming the hydrophobic treatment layer.

(5) The electronic device according to any one of (11) to (14) above, in which
an inorganic buffer layer is disposed between the hydrophobic treatment layer and the insulation layer and the lower transparent electrode film.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging element, comprising:
an insulation film laminated on a semiconductor substrate;
a lower transparent electrode film formed and separated by the insulation film per pixel;
an inorganic buffer layer disposed on a surface of the insulation film and the lower transparent electrode film;
a hydrophobic treatment layer disposed on the inorganic buffer layer;
an organic photoelectric conversion layer laminated on the hydrophobic treatment layer; and
an upper transparent electrode film laminated on the organic photoelectric conversion layer.

2. The imaging element according to claim 1, wherein the hydrophobic treatment layer is formed by performing a surface treatment of surfaces of the inorganic buffer layer with a silylation agent.

3. The imaging element according to claim 2, wherein hexamethyl silazane is used as the silylation agent used in the surface treatment for forming the hydrophobic treatment layer.

4. The imaging element according to claim 2, wherein one of 1,1,3,3-tetramethyl disilazane [TMDS, [SiH(CH$_3$)$_2$]$_2$NH], N-trimethylsilyldimethylamine (TMSDMA, (CH$_3$)$_5$NSi), N-dimethyl silyldimethylamine (DMSDMA, (CH$_3$)$_4$NHSi), 1-trimethylsilylpyrole (TMS pyrole), N,O-bis(trimethylsilyl) trifuluoroacetamide) (BSTFA) and bis(dimethylamino)dimethylsilane (BDMADMS) is used as the silylation agent used in the surface treatment for forming the hydrophobic treatment layer.

5. A method of producing an imaging element, comprising:
laminating an insulation film on a semiconductor substrate;
forming a lower transparent electrode film separated by the insulation film per pixel;
forming an inorganic buffer layer on a surface of the insulation film and the lower transparent electrode film;
forming a hydrophobic treatment layer on the inorganic buffer layer;
laminating an organic photoelectric conversion layer on the hydrophobic treatment layer; and
laminating an upper transparent electrode film on the organic photoelectric conversion layer.

6. The method of producing the imaging element according to claim 5, wherein the hydrophobic treatment layer is formed by performing a surface treatment of surfaces of the inorganic buffer layer with a silylation agent.

7. The method of producing the imaging element according to claim 6, wherein hexamethyl silazane is used as the silylation agent used in the surface treatment for forming the hydrophobic treatment layer.

8. The method of producing the imaging element according to claim 6, wherein one of 1,1,3,3-tetramethyl disilazane [TMDS, [SiH(CH$_3$)$_2$]$_2$NH], N-trimethylsilyldimethylamine (TMSDMA, (CH$_3$)$_5$NSi), N-dimethyl silyldimethylamine (DMSDMA, (CH$_3$)$_4$NHSi), 1-trimethylsilylpyrole (TMS pyrole), N,O-bis(trimethylsilyl)trifuluoroacetamide) (BSTFA) and bis(dimethylamino)dimethylsilane (BDMADMS) is used as the silylation agent used in the surface treatment for forming the hydrophobic treatment layer.

9. An electronic device having an imaging element, comprising:
an insulation film laminated on a semiconductor substrate;
a lower transparent electrode film formed and separated by the insulation film per pixel;
an inorganic buffer layer disposed on a surface of the insulation film and the lower transparent electrode film;
a hydrophobic treatment layer disposed on the inorganic buffer layer;
an organic photoelectric conversion layer laminated on the hydrophobic treatment layer; and
an upper transparent electrode film laminated on the organic photoelectric conversion layer.

10. The electronic device according to claim 9, wherein the hydrophobic treatment layer is formed by performing a surface treatment of surfaces of the inorganic buffer layer with a silylation agent.

11. The electronic device according to claim 10, wherein hexamethyl silazane is used as the silylation agent used in the surface treatment for forming the hydrophobic treatment layer.

12. The electronic device according to claim 10, wherein one of 1,1,3,3-tetramethyl disilazane [TMDS, [SiH(CH$_3$)$_2$]$_2$NH], N-trimethylsilyldimethylamine (TMSDMA, (CH$_3$)$_5$NSi), N-dimethyl silyldimethylamine (DMSDMA, (CH$_3$)$_4$NHSi), 1-trimethylsilylpyrole (TMS pyrole), N,O-bis(trimethyl silyl)trifuluoroacetamide) (BSTFA) and bis(dimethylamino)dimethylsilane (BDMADMS) is used as the silylation agent used in the surface treatment for forming the hydrophobic treatment layer.

\* \* \* \* \*